United States Patent [19]

Tang

[11] Patent Number: 4,547,794
[45] Date of Patent: Oct. 15, 1985

[54] REUSABLE FIXTURE FOR HOLDING A SEGMENT OF A FLEXIBLE STRIP

[75] Inventor: Ching-Chiang Tang, Hayward, Calif.

[73] Assignee: Amdahl Corporation, Sunnyvale, Calif.

[21] Appl. No.: 661,965

[22] Filed: Oct. 17, 1984

[51] Int. Cl.[4] .................... H01L 23/48; H01L 23/02; H02G 13/08; B32B 3/30
[52] U.S. Cl. .................................... 357/70; 357/69; 357/74; 40/361; 174/52 FP; 428/120; 428/131; 428/134; 428/156
[58] Field of Search .............. 428/120, 131, 134, 156; 357/70, 69, 74; 40/361; 174/52 FP

[56] References Cited

U.S. PATENT DOCUMENTS

| Re. 30,604 | 5/1981 | Kowalski | 357/70 |
| 4,007,479 | 2/1977 | Kowalski | 357/70 |
| 4,069,496 | 1/1978 | Kowalski | 357/70 |

Primary Examiner—Alexander S. Thomas
Attorney, Agent, or Firm—Fliesler, Dubb, Meyer & Lovejoy

[57] ABSTRACT

A reusable fixture for holding a segment of a flexible strip used in the fabrication of an integrated circuit device is provided. In the fixture there is provided a plurality of elongated movable cantilevered beam members which are movable from a first position to a second position for insertion and removal of a segment of a flexible strip therein and therefrom. The segment is held in the fixture by means of the free ends of the beam members which overlie the edges of the segment when the beam members are in their first position.

18 Claims, 5 Drawing Figures

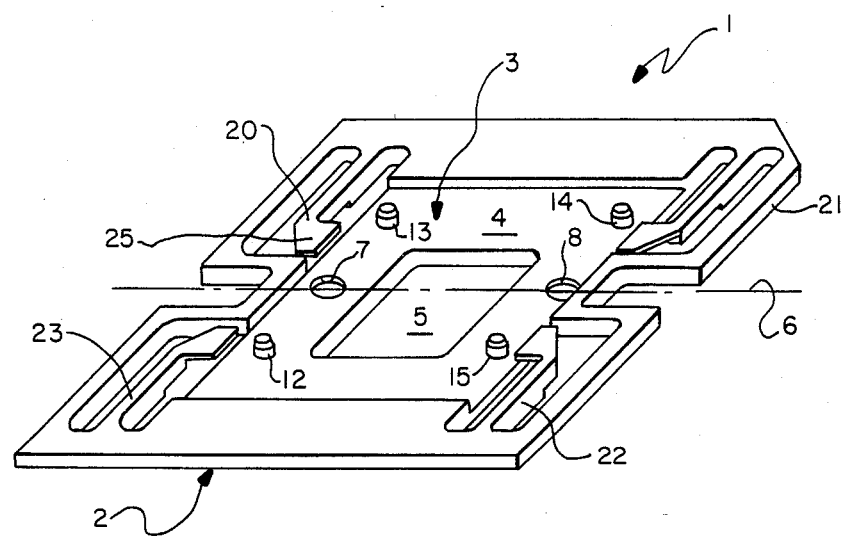
FIG. —1
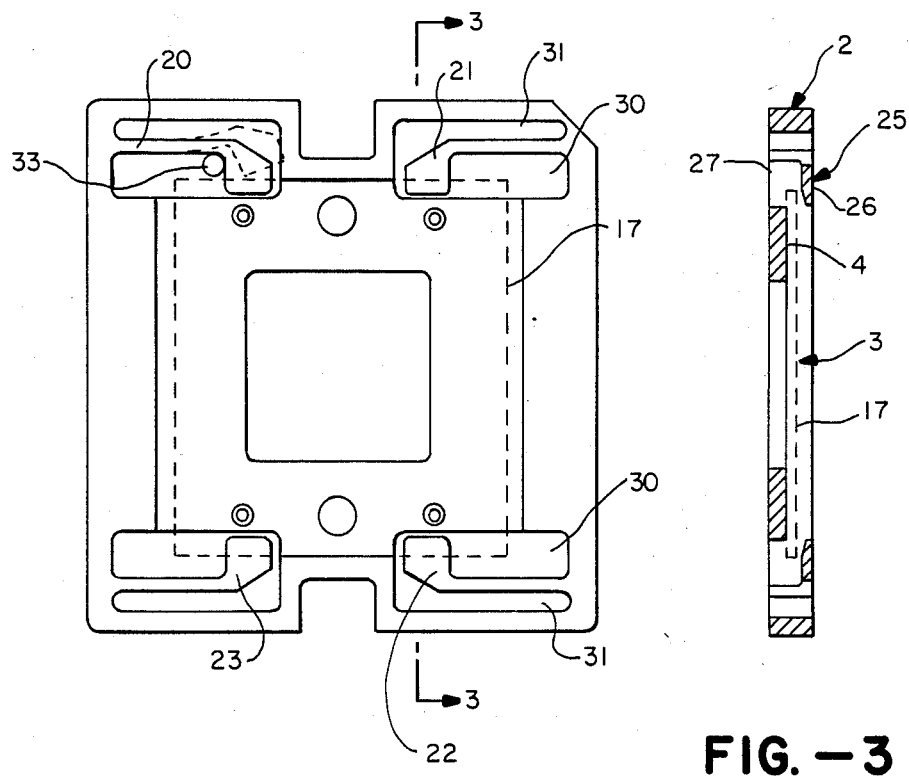
FIG. —2
FIG. —3

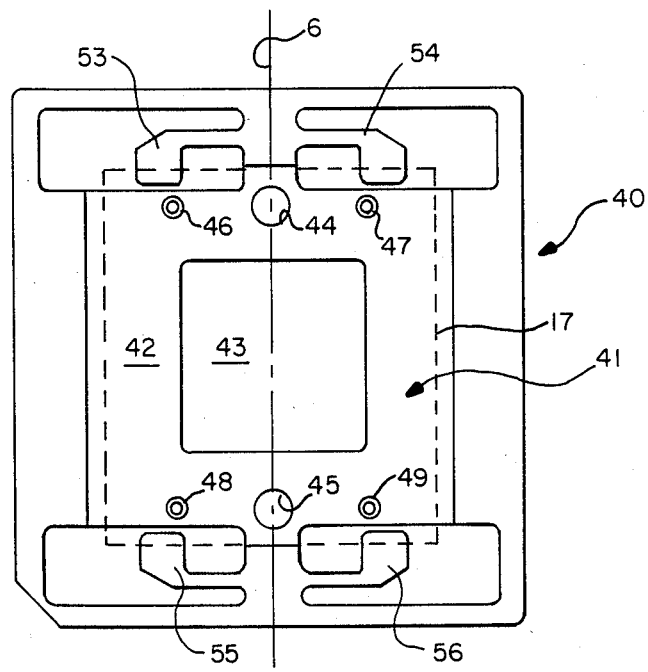
FIG.—4
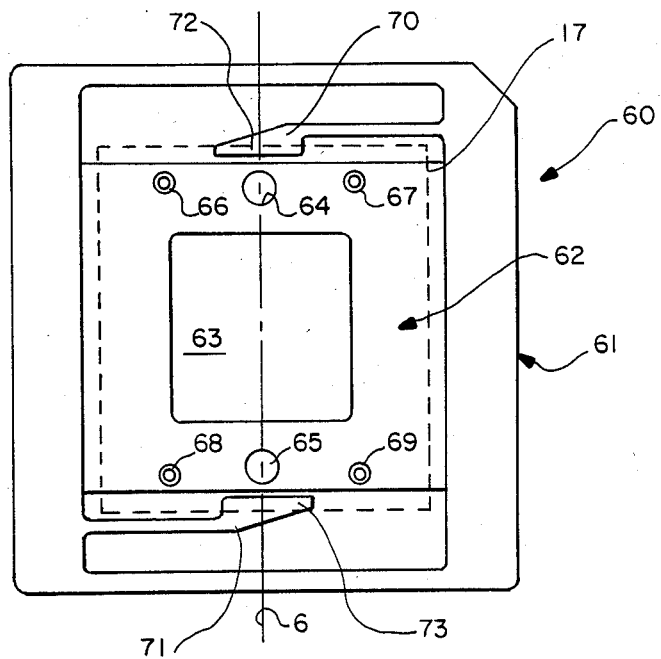
FIG.—5

REUSABLE FIXTURE FOR HOLDING A SEGMENT OF A FLEXIBLE STRIP

FIELD OF THE INVENTION

The present invention relates to processes and apparatus used in the fabrication of integrated circuit (IC) devices in general and to a reusable fixture for holding a segment of a thin flexible strip on which has been attached a flexible beam lead and to which lead an IC chip has been or is to be bonded in particular.

BACKGROUND OF THE INVENTION

In the fabrication of an IC device, an IC chip is attached to a lead frame. The lead frame is provided to facilitate the electrical connection of apparatus to the chip.

Currently, it is the practice in many IC device fabrication processes to form or bond a plurality of flexible lead frames on a long strip of flexible material, which strip has the general appearance of a strip of motion picture film with sprocket holes located along the lateral edges thereof.

At some point in the fabrication of the IC device, the strip is cut into segments with each segment comprising at least one lead frame.

To protect the segment, the beam leads, and an IC chip bonded thereto during subsequent steps of the device fabrication, it has become the practice to removably mount each segment in a reusable fixture.

DESCRIPTION OF THE PRIOR ART

Illustrative of reusable fixtures of the type to which the present invention is believed to be most closely related are those shown and described in U.S. Pat. No. 4,007,479, issued Feb. 8, 1977, and U.S. Pat. No. 4,069,496, issued Jan. 17, 1978.

In U.S. Pat. No. 4,007,479 there is disclosed a reusable fixture for removably holding a segment of a thin flexible strip as described above. In the fixture there is provided a plurality of four lugs or projections. Each of the lugs is provided to project through and frictionally engage the edges of an associated one of a plurality of sprocket holes which extend along the lateral edges of the segment. For convenience, these sprocket holes are called handling or attachment sprocket holes.

In practice, the above-described use of lugs or projections which frictionally engage the handling or attachment sprocket holes has revealed two problems. One of the problems revealed is that occasionally that portion of a segment that projects beyond a line joining the outer edges of the attachment sprocket holes bends, or curls, enough so that an edge of a segment projects above the surface of the fixture. As a result, the segment and its IC are not properly protected by the fixture. The second problem revealed, arising from the use of four lugs, or projections, that fit within four attachment sprocket holes of a segment, is that such an arrangement does not lend itself to automating the removal of a segment from such a fixture. This problem arises because no means is provided in the fixture to enable the ready application of a force at the centroid of the edges of the attachment sprocket holes to remove the segment from the fixture. As a result, the removal force which is applied is applied with such a magnitude and at such a point on the segment that one side of each attachment sprocket hole tends to bind against its attachment lug which significantly increases the forces necessary to remove a segment from a fixture in which it is mounted, thus increasing the risk of damage to the chip mounted on the segment.

In U.S. Pat. No. 4,069,496, which discloses an improvement over the above-described fixture, there is disclosed a reusable fixture for removably holding a segment of a thin flexible strip comprising a plurality of pairs of attachment lugs or projections.

The lugs in each pair comprise facing protrusions which overlie adjacent edges of a pair of adjacent sprocket holes of a segment inserted in the fixture. Between the lugs of each pair there is provided in the fixture a detachment opening for providing access to that portion of the segment which lies between the adjacent sprocket holes.

When a segment is to be removed from the fixture, a rod is projected through the detachment opening and pressed against the segment with sufficient energy to force the segment over the facing protrusions on the lugs.

While the fixture disclosed in U.S. Pat. No. 4,069,496 ostensibly addresses some of the problems encountered in the use of the prior known fixture, there are found to be still a number of problems associated with the prior known fixtures.

One of the problems is associated with the use of facing protrusions over which a segment must be forcibly moved during insertion in and removal from the fixture. This is due to the fact that as a succession of segments are inserted in and removed from the fixture and the edges of the sprocket holes are "snapped" over the protrusions, the protrusions are eventually worn away and the fixture must be replaced.

Another problem encountered in the use of the prior known fixtures is associated with the lack of freedom of movement of a segment in the fixture.

In order to facilitate the "snapped" insertion and removal of a segment into and from the fixture, the extension of the facing protrusions must be limited. This limiting in turn requires that the segment fit relatively tightly about the attachment lugs. As a consequence, centering of a segment in a machine used for fabricating the IC device is limited or requires centering of the fixture, as well as the segment.

A further disadvantage of the prior known fixtures arises from the fact that different tooling is required to insert and remove a segment into and from the fixtures, respectively. In the use of the prior fixtures, one tool is required to insert the segment in the fixture and an entirely different tool is required to remove the segment from the fixture.

SUMMARY OF THE INVENTION

For the foregoing reasons, a principal object of the present invention is a reusable fixture for removably holding a segment of a thin strip of material used in the fabrication of an IC device which does not require the forced snapping of the segment into and therefrom.

Another object of the present invention is a fixture as described above which permits greater movement of the segment in the fixture for centering the segment in a machine in which the fixture is inserted without moving the fixture than has been possible in prior known related fixtures.

Still another object of the present invention is a fixture which uses identical tooling for both inserting a segment in and removing a segment from a fixture.

In accordance with the above objects, there is provided a fixture comprising a body member and a plurality of elongated laterally separated movable beams. Each of the beams is resiliently attached at one end to the body member in a cantilevered fashion. The free end of each of the beams is provided with an inwardly directed enlarged portion. A hole is provided in the frame beneath each beam.

In use, a rod or the like is projected through the hole in the frame beneath each beam and moved laterally outwardly. As each rod is moved laterally outwardly, it engages the beam associated therewith moving the free end of the beam laterally outwardly. After the free end of the beam is moved a predetermined amount, a segment of a thin strip of material used in the fabrication of an IC device is inserted into the fixture between the beams, and the rods are moved. When the rods are removed, the beams snap inwardly to their initial position. When the beams have returned to their initial position, the enlarged inwardly directed portions of the free end of each of the beams overlies a lateral edge of the segment allowing the segment to be moved longitudinally and laterally therebeneath. Movement of the beams to remove a segment from the fixture is accomplished in the same manner.

Since, in use, none of the beams is stressed to its yield point and is not forced against a segment during insertion and removal of the segment into and from a fixture in an abrasive manner and overlies the segment when holding a segment, the insertion and removal of a segment into and from a fixture does not wear out a beam and the segment has more freedom of movement in the fixture than has been available in prior known related fixtures.

BRIEF DESCRIPTION OF THE DRAWING

The above and other objects, features and advantages of the present invention will become apparent from the following detailed description of the accompanying drawing in which:

FIG. 1 is a perspective view of an embodiment of the present invention;

FIG. 2 is a plan view of the embodiment of FIG. 1;

FIG. 3 is a cross-sectional view taken in the direction of lines 3—3 of FIG. 2;

FIG. 4 is a top plan view of another embodiment of the present invention; and

FIG. 5 is a top plan view of still another embodiment of the present invention.

DETAILED DESCRIPTION OF THE INVENTION

Referring to FIGS. 1, 2 and 3, there is provided in accordance with the present invention a fixture designated generally as 1 for removably retaining a segment of a flexible strip of material used in the fabrication of an integrated circuit (IC) device. In the fixture 1 there is provided a body member designated generally as 2. In the body member 2 there is provided a cavity 3 having a base 4. In the base 4 there is provided a square-shaped hole 5. On opposite sides of the hole 5 located on a transverse axis 6 of the body member 2 there is provided a pair of segment aligning holes 7 and 8. Extending perpendicularly from the base 4 there is provided a plurality of segment receiving pins 12, 13, 14 and 15. Pins 12 and 13 are equidistantly spaced from the hole 7 along a line parallel to an edge of the cavity 3. The pins 14 and 15 are equidistantly spaced from the hole 8 along a line parallel to the opposite edge of the cavity 3. As will be further described below, the location of the holes 7, 8 and the pins 12–15 correspond to the location of sprocket holes along the lateral edges of a segment 17 of a flexible strip of beam lead inserted in the fixture 1 as shown by dashed lines in FIGS. 2 and 3.

Extending from the body member 2 in a cantilever fashion and in a direction parallel with a corresponding edge of the cavity 3, there is provided a plurality of elongated movable beam members 20, 21, 22 and 23. Each of the beam members 20–23 comprise a free end designated generally as 25. The free end 25 comprises a tab portion 26. The tab portion 26 is provided with a surface 27 which faces the base 4 of the cavity 3. The surface 27 is beveled from the interior end of the tab 26 toward a corresponding edge of the cavity 3 as shown most clearly in FIG. 3.

As shown most clearly in FIG. 2, there is provided on either side of each of the beam members 20–23 a pair of spaces 30 and 31. As shown with respect to the beam 20, the spaces 30 and 31 are provided for allowing each of the beam members to be moved from a first position shown in solid lines, to a second position shown in dash lines. In practice, the movement of each of the beams 20–23 is accomplished by a tool represented by a circle designated 33 shown adjacent to the beam 20 in FIG. 2.

Referring to FIG. 4, there is provided in another embodiment of the present invention a body member designated generally as 40. In the body member 40 there is provided a cavity designated generally as 41 having a base 42. In the base 42 there is provided a square-shaped aperture 43, a plurality of holes 44 and 45, a plurality of pin members 46, 47, 48 and 49 and a plurality of elongated cantilevered movable beam members 53, 54, 55 and 56.

The size and location of the above-identified features of the body member 40 are substantially identical to the corresponding features identified and described above with respect to the embodiment of FIGS. 1–3 except for the fact that the beam members 53–56, instead of extending from the body member 40 in a direction parallel to an edge of the cavity 41 toward a transverse axis 6 as described above with respect to the embodiment of FIGS. 1–3, extend outwardly from the transverse axis 6 toward opposite ends of the cavity 41.

Referring to FIG. 5, there is provided in still another embodiment of the present invention a fixture designated generally as 60. In the fixture 60 there is provided a body member designated generally as 61. In the body member 61 there is provided a cavity 62. In the cavity 62 there is provided a generally square-shaped hole 63, a plurality of segment aligning holes 64 and 65 and a plurality of pin members 66, 67, 68 and 69. Extending from the body member 61 is a cantilevered fashion in a direction parallel to opposite edges of the cavity 62, there is provided a plurality of movable beam members 70 and 71. The beam members 70 and 71 extend from the body member 2 toward a transverse axis 6 of the body member 61. The free ends 72 and 73 are centrally located on the transverse axis 6. The cavity 62, the holes 63–65 and the pins 66–69 have substantially the same size and location as the corresponding features described above with respect to the embodiments of FIGS. 1–4.

In use, the fixture of any of the embodiments is inserted in a machine used in the fabrication of an IC device. Since each of the embodiments is used in essentially the same way, only the use of the embodiment of FIGS. 1-3 will be described.

Thus, in using the embodiment of FIGS. 1-3, a pin in the machine, corresponding to the pin 33 of FIG. 2, is moved either upwardly or downwardly to engage an inner surface of each of the elongated beam members as shown in the upper lefthand corner of FIG. 2 and is thereafter moved outwardly to move the corresponding beam member from a first position shown in solid lines to a second position shown in dash lines. When each of the beam members is moved from its first position to its second position, a segment 17 of a flexible strip having sprocket holes along opposite edges thereof is inserted in the cavity of the fixture, e.g., cavity 3 of FIGS. 1-3. As the segment 17 is inserted in the cavity, four of the sprocket holes are centered over the pin members 12-15 while two intermediate sprocket holes are placed over the aligning holes 7-8. After the segment is placed over the pins 12-15, the pin member 33 holding each of the beam members in their second position is withdrawn, allowing the beam members to return to their first position. As the beam members return to their first position, the tab 26 crosses over the corresponding edge of the cavity 3, capturing the segment 17 between the tab 26 and the base 4.

In practice, the size of the sprocket holes in which the pins 12-15 are inserted is somewhat larger than the transverse cross-section of the pins 12-15 such that the segment is free to be moved relative to the pins 12-15 in a plane parallel to the base 4. Such movement is provided by a centering tool which is inserted through the holes 7 and 8 and the corresponding sprocket holes in the segment 17 inserted in the cavity 3. With the holes 7 and 8 having a diameter which is larger than the size of the sprocket holes in the segment, the tool can be moved laterally as well as longitudinally for moving the segment without moving the fixture. In this manner, a segment may be centered in a machine without a corresponding movement of the fixture.

After the necessary processing of the segment is completed, the pin 33 can once again be used to move the beam members from their first position to their second position to release the segment from the fixture.

While a preferred embodiment and several alternative embodiments of the present invention are described, it is contemplated that other modifications may be made thereto without departing from the spirit and scope of the present invention. Accordingly, it is intended that the scope of the invention not be limited to the embodiments described but rather be determined by reference to the claims hereinafter provided.

I claim:

1. A fixture comprising:
    a body member having a cavity for receiving a segment of a flexible strip during fabrication of an integrated circuit device; and
    an elongated movable beam member which extends from said body member in a cantilever fashion in a direction parallel to an edge of said cavity and is movable between a first and a second position, said beam member having a free end which extends over an edge of said cavity for retaining a segment of a flexible strip received therein when said beam member is in its first position.

2. A fixture according to claim 1 comprising means for returning said beam member to said first position after a force which moves said beam member from said first position to said second position is removed therefrom.

3. A fixture according to claim 1 wherein said cavity comprises a base and said free end of said beam member comprises a beveled surface facing said base, said beveled surface extending from an edge of said free end toward said edge of said cavity.

4. A fixture according to claim 1 wherein said cavity comprises a base and comprising a pin member which extends from said base for inserting in a sprocket hole in said segment.

5. A fixture according to claim 4 for use with a segment having a predetermined size sprocket hole wherein said pin member comprises a transverse cross-section which permits movement of said segment relative to said pin member in a plane parallel to said base of said cavity.

6. A fixture according to claim 1 wherein said cavity comprises a base with a segment aligning hole located therein through which a tool can be inserted for moving a segment of a flexible strip located in said cavity in a plane parallel and relative to said base.

7. A fixture according to claim 6 for use with a segment having a sprocket hole therein comprising means for positioning said sprocket hole over said segment aligning hole when said segment is located in said cavity.

8. A fixture according to claim 1 wherein said beam member extends from said body member toward a transverse axis of said body member.

9. A fixture according to claim 1 wherein said beam member extends from a transverse axis of said body toward an end of said body member.

10. A fixture comprising:
    a body member having a cavity for receiving a segment of a flexible strip during fabrication of an integrated circuit device; and
    a plurality of elongated movable beam members, each of which extend from said body member in a cantilever fashion in a direction parallel to an edge of said cavity and is movable between a first and a second position, each of said beam members having a free end which extends over an edge of said cavity for retaining a segment of a flexible strip received therein when said beam member is in its first position.

11. A fixture according to claim 10 wherein a first and a second one of said plurality of beam members extend along opposite edges of said cavity.

12. A fixture according to claim 11 wherein the free ends of said first and said second beam members are located on the transverse axis of said body member.

13. A fixture according to claim 10 comprising means for returning each of said beam members to said first position after a force which moves said beam member from said first position to said second position is removed therefrom.

14. A fixture according to claim 10 wherein said cavity comprises a base and said free end of each of said beam members comprises a beveled surface facing said base, said beveled surface extending from an edge of said free end toward one of a pair of opposite edges of said cavity.

15. A fixture according to claim 10 wherein said beam members extend from said body member toward a transverse axis of said body member.

16. A fixture according to claim 10 wherein said beam members extend from a transverse axis of said body member toward an end of said body member.

17. A fixture according to claim 10 wherein said body member comprises a transverse axis, said plurality of beam members comprises a first, second, third and fourth beam member and the free ends of two of said beam members are located on an axis which extends parallel to said transverse axis on one side of said transverse axis and the other two of said beam members are located on an axis which extends parallel to said transverse axis on the opposite side of said transverse axis.

18. A fixture comprising:
a body member;
a cavity having a base centrally disposed within said body member for receiving a segment of a flexible strip which is used during fabrication of an integrated circuit device;
a square-shaped hole centrally disposed within said cavity base for providing access to a corresponding section of a segment of a flexible strip received in said cavity;
a round hole disposed in said cavity base adjacent to each one of two opposite sides of said square-shaped hole for providing access to a corresponding sprocket hole in a segment of a flexible strip received in said cavity;
a pin member which extends from said cavity base adjacent to each one of two opposite sides of each of said round holes for engaging a corresponding sprocket hole in a segment of a flexible strip received in said cavity; and
an elongated resilient movable beam member located adjacent to each one of two opposite edges of said cavity which is movable between a first and a second position and extends from said body member in a cantilever fashion in a direction parallel to a corresponding one of said edges, said beam member having a free end which extends over a corresponding edge of a segment of a flexible strip received in said cavity when said beam member is in its first position for retaining a segment of a flexible strip received in said cavity.

* * * * *